(12) United States Patent
Persson et al.

(10) Patent No.: US 9,510,170 B2
(45) Date of Patent: Nov. 29, 2016

(54) DATA COMPRESSION OPERATIONS IN A COMMUNICATIONS NETWORK

(71) Applicant: TELEFONAKTIEBOLAGET L M ERICSSON (PUBL), Stockholm (SE)

(72) Inventors: Fredrik Persson, Märsta (SE); Hans Eriksson, Sollentuna (SE); Jens Knutsson, Enebyberg (SE); Paul Stjernholm, Lidingö (SE); Lars Westberg, Enköping (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 101 days.

(21) Appl. No.: 14/407,754

(22) PCT Filed: Jun. 12, 2013

(86) PCT No.: PCT/EP2013/062175
§ 371 (c)(1),
(2) Date: Dec. 12, 2014

(87) PCT Pub. No.: WO2013/186273
PCT Pub. Date: Dec. 19, 2013

(65) Prior Publication Data
US 2015/0172891 A1    Jun. 18, 2015

Related U.S. Application Data

(60) Provisional application No. 61/659,035, filed on Jun. 13, 2012.

(51) Int. Cl.
*H04W 4/18* (2009.01)
*H04L 29/08* (2006.01)
(Continued)

(52) U.S. Cl.
CPC ............... *H04W 4/18* (2013.01); *H03M 7/30* (2013.01); *H04L 29/0604* (2013.01); *H04L 67/2823* (2013.01); *H04L 69/04* (2013.01);
(Continued)

(58) Field of Classification Search
None
See application file for complete search history.

(56) References Cited

U.S. PATENT DOCUMENTS

| | | | |
|---|---|---|---|
| 2004/0107298 A1* | 6/2004 | Westphal | H04L 29/06 709/247 |
| 2007/0277035 A1* | 11/2007 | Patel | H04L 9/0822 713/168 |

(Continued)

OTHER PUBLICATIONS

3GPP TS 23.060 V12.6.0, 3rd Generation Partnership Project; Technical Specification Group Services and System Aspects; General Packet Radio Service (GPRS) General Packet Radio Service (GPRS; Service description, Stage 2 (Release 12); Sep. 2014.

(Continued)

*Primary Examiner* — Min Jung
(74) *Attorney, Agent, or Firm* — Patent Portfolio Builders, PLLC

(57) ABSTRACT

A method of performing a compression operation on data in a mobile communication network. An intermediate node located between a mobile terminal and a mobility anchor point node, receives a data payload. If the intermediate node has access to compression information required to perform the compression operation, it performs the compression operation to generate a modified data payload and sends the modified data payload to a next node. If the intermediate node does not have access to compression information required to perform the compression operation, it sends the data payload to the next node. The compression operation may be data compression or de-compression.

15 Claims, 6 Drawing Sheets

(51) Int. Cl.
*H04L 29/06* (2006.01)
*H03M 7/30* (2006.01)
*H04W 28/02* (2009.01)
*H04W 88/16* (2009.01)

(52) U.S. Cl.
CPC ....... *H04W28/0226* (2013.01); *H03M 7/3091* (2013.01); *H04W 88/16* (2013.01)

(56) References Cited

U.S. PATENT DOCUMENTS

| | | | | |
|---|---|---|---|---|
| 2009/0316774 | A1* | 12/2009 | Yang | H03M 7/30 375/240 |
| 2011/0249610 | A1* | 10/2011 | Ho | H04B 7/2606 370/315 |
| 2015/0124683 | A1* | 5/2015 | Stjernholm | H04L 69/04 370/312 |
| 2015/0156653 | A1* | 6/2015 | Persson | H04L 41/5067 370/252 |
| 2015/0172421 | A1* | 6/2015 | Stjernholm | H04W 36/00 370/328 |

OTHER PUBLICATIONS

3GPP TS 23.401 V12.6.0, 3rd Generation Partnership Project; Technical Specification Group Services and System Aspects; General Packet Radio Service (GPRS) enhancements for Evolved Universal Terrestrial Radio Access Network (E-UTRAN) access (Release 12); Sep. 2014.

* cited by examiner

DATA COMPRESSION OPERATIONS IN A COMMUNICATIONS NETWORK

This application is a 371 of PCT/EP2013/062175, filed Jun. 12, 2013, which claims the benefit of U.S. Provisional Application No. 61/659,035, filed Jun. 13, 2012, the disclosures of which are fully incorporated herein by reference.

TECHNICAL FIELD

The invention relates to data compression operations in a mobile communications network.

BACKGROUND

When sending data over a communications network, compression is a technique that is used to minimize the bandwidth required by that data in order to make the communications network more efficient. This is particularly important for communications networks that rely on wireless transmission of data. Wireless Area Network (WAN) acceleration/optimization of sending data relies on many different optimization techniques to reduce the bandwidth needed by services when sending data. This improves the Quality of Experience (QoE) for the end user and network transmission costs for operators.

Compressing the size of data content, using techniques such as de-duplication, may significantly reduce the bandwidth required, and solutions to do this are commercially available.

The process of de-duplication is illustrated in FIG. 1, in which a compressor 1 or a de-compressor 2 identifies byte patterns in a payload of a data stream and associates an identified byte pattern with a shorter index, referred to as a signature. This is done for many byte patterns, leading to many signatures, which are stored in a database. The data payload and the associated signatures are transmitted to the remote side, where the same association is stored in a database. This phase is denoted as the learning phase. At some point in time the de-compressor 2 agrees with the compressor 1 to start sending compressed data over the link. Alternatively, a signature can be assigned to a pattern of bytes as soon as the pattern is repeated. Subsequent byte patterns identified by the compressor 1 are replaced with the corresponding signatures, which are sent over the link. At the de-compressor 2, the signatures are again replaced with the full byte patterns. The original data stream is thus recreated and further processed as normal. Solutions are implemented in the network user plane and do not rely on the control plane.

A compressor 1 typically associates the signatures with a de-compressor 2. The correct signatures may therefore rely on knowledge of the identity of the de-compressor 2 (or compressor 1). It is possible that a compressor 1 may associate a signature with a particular byte pattern for sending the data associated with the byte pattern to a particular de-compressor 2, and associate a different signature to the same byte pattern for sending the data associated with the byte pattern to a different de-compressor.

Content compression and de-duplication is available between a server and one or more mobile clients in an enterprise scenario. However, if the server side is integrated in a mobile network node below a mobility anchor point, for example in a Serving Gateway (SGW), Serving GPRS Support Node (SGSN) or Radio Network Controller (RNC), then the compression and de-compression must take into account mobility of the mobile terminal. The network side needs to be able to compress data so that any mobile terminal may de-compress it, and be able to de-compress data from any mobile terminal. In this case, a mobile terminal may roam into a new cell handled by a different de-compressor, but the network side compressor may not have the identity of the different de-compressor.

FIG. 2 illustrates a network architecture intended for an enterprise scenario in which a central office 3 connects to one or more branch offices, or an office connects to a mobile workforce 4, 5, 6. In this case, the office 3 side uses compression on the downlink and decompression on the uplink, and the mobile workforce side uses de-compression on the downlink and compression on the uplink.

Existing solutions for mobile clients 4, 5, 6 in an enterprise scenario cannot be directly deployed for a public scenario in a mobile network infrastructure if the downlink compression/uplink de-compression is deployed in a network node below the mobility anchor point, such as a PDN Gateway (PGW) 7 (or a GGSN), as shown in FIG. 3. The reason that existing solutions cannot be deployed in this type of architecture is that the identity of the de-compressor may change dynamically owing to mobile terminal mobility. In this example, a terminal 4 is connected to a source eNodeB 8 and a source SGW 9 but, because of mobility of the terminal 4, may subsequently connect to a target eNodeB 10 and a target SGW 11. The compressor at the office side needs to know which signatures can be used when compressing data towards a certain de-compressor. For example, if a mobile terminal is connected to a source SGW 9 in a Long Term Evolution (LTE) network, the compressor at the terminal 4 knows the identity of the de-compressor associated with the source SGW, and so can send compressed data using signatures. If the mobile terminal subsequently moves and connects to a new target SGW 11, the compressor must communicate with a new de-compressor.

Existing solutions to account for mobile terminal mobility are based on the de-compressor sending a notification to the compressor that it has received an unknown signature in a session. This will happen after handover of the mobile terminal, when the new de-compressor has not established a signature database with the compressor. The compressor then resets compression for that session and recommences the learning phase again. However, this approach result in the compression being less efficient since the learning phase can take around 2 hours to reach a compression efficiency of 80%.

One solution to avoid repeating the learning phase when deploying compression in a public mobile network is to locate the downlink compression unit and uplink decompression unit in a network node at a mobility anchor point. Examples of this are a PDN Gateway or a GGSN. FIG. 3 illustrates an LTE network. In this example, the downlink compression/uplink decompression is located at the PGW. If the mobile terminal moves from a source eNodeB to a new target eNodeB, the compression/decompression is still handled by the same PGW, as the same PGW is associated with both the source eNodeB and the target eNodeB. A drawback with this solution is that the compressor/de-compressor may get overloaded due to the aggregation of traffic in the node.

SUMMARY

It is an object of the invention to address the problems caused by mobile terminal mobility when sending and receiving compressed data. Furthermore, it is an object of the invention to mitigate the problems associated with overloading a compressor/de-compressor located at a mobility anchor point node.

According to a first aspect, there is provided a method of performing a compression operation on data in a mobile communication network. An intermediate node located between a mobile terminal and a mobility anchor point node receives a data packet. If the intermediate node has access to compression information required to perform the compression operation, it performs the compression operation to generate a modified data packet and sends the modified data packet to a next node. If the intermediate node does not have access to compression information required to perform the compression operation, it sends the data packet to the next node. An advantage of this is that hierarchic principles for handling compression operations such as data compression or decompression can be applied. This allows offloading of compression operations to more evenly balance loads on the network nodes.

As an option, the compression operation comprises data de-compression, wherein the data packet comprises compressed data and the modified data packet comprises de-compressed data. Alternatively, the compression operation comprises compression, wherein the data packet comprises uncompressed data and the modified data packet comprises compressed data. Either way, the hierarchic solution helps to balance network loads on uplinks and downlinks.

The compression information optionally comprises a signature and an associated byte pattern.

Optional examples of the intermediate node include an enhanced Node B, a Radio Optional examples of the mobility anchor point node include any of a Packet Data Network Gateway and a Gateway GPRS Support Node.

As an option, prior to receiving the data packet, the data packet comprising compressed data, the intermediate node determines an identity of an uplink node having de-compression capability. This can optionally be performed using any of signalling in a mobile network control plane, application signalling in a mobile network user plane, and using pre-configured information identifying the uplink node.

According to a second aspect, there is provided a network node for handling a compression operation on data in a mobile communication network. The network node is provided with a receiver for receiving a data packet. A database is provided that contains compression information. A processor is provided for determining whether the database includes compression information required to perform the compression operation. The processor is further arranged to, in the event that the database includes compression information required to perform the compression operation, perform the compression operation to generate a modified data packet, and send the modified data packet to a next node via a transmitter. The processor is also arranged to, in the event that the database does not include compression information required to perform the compression operation, send the data packet to the next node. An advantage of this is that hierarchic principles for handling compression operations such as data compression or decompression can be applied to network nodes. This allows offloading of compression operations to more evenly balance loads on the network nodes.

As an option, the processor is arranged to perform data de-compression, wherein the data packet comprises compressed data and the modified data packet comprises de-compressed data. As an alternative option, the processor is arranged to perform data compression, wherein the data packet comprises uncompressed data and the modified data packet comprises compressed data.

The compression information optionally comprises a signature and an associated byte pattern.

Examples of the network node include any of an enhanced Node B, a Radio Network Controller, a Serving GPRS Support Node and a Serving Gateway.

The processor is optionally arranged to, prior to receiving the data packet, determine an identity of an next node having the capability of performing an associated compression operation. In this case, the network node is optionally provided with a second transmitter for sending a request to the next node, and a second receiver for receiving a response from the next node, the response indicating any of an identity and capabilities of any of a compressor and a de-compressor located at the next node.

The network node optionally comprises a second database comprising pre-configured information identifying the next node.

According to a third aspect, there is provided a computer program comprising computer readable code which, when run on a network node causes the network node to perform the method described above in the first aspect.

According to a fourth aspect, there is provided a computer program product comprising a computer readable medium and a computer program as described above in the third aspect, wherein the computer program is stored on the computer readable medium.

DETAILED DESCRIPTION

Figure 1:
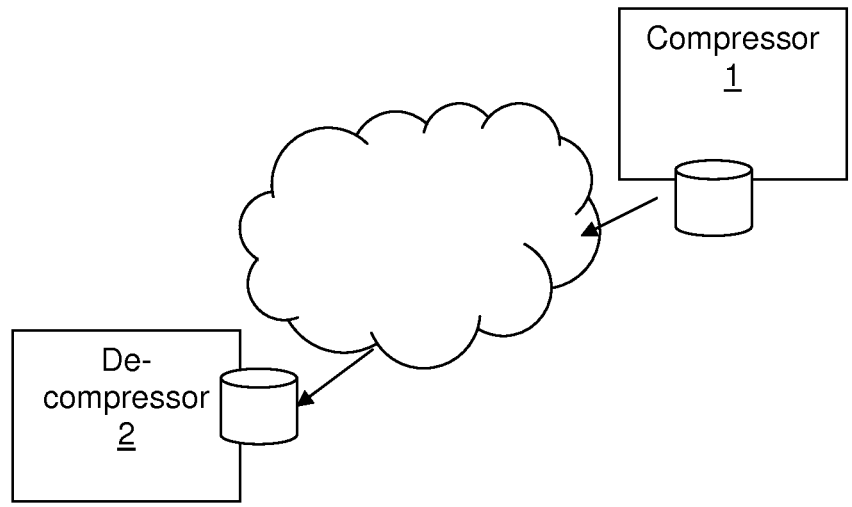
FIG. 1 illustrates schematically in a block diagram a network architecture and signalling for performing de-duplication when sending compressed data.
Figure 2:
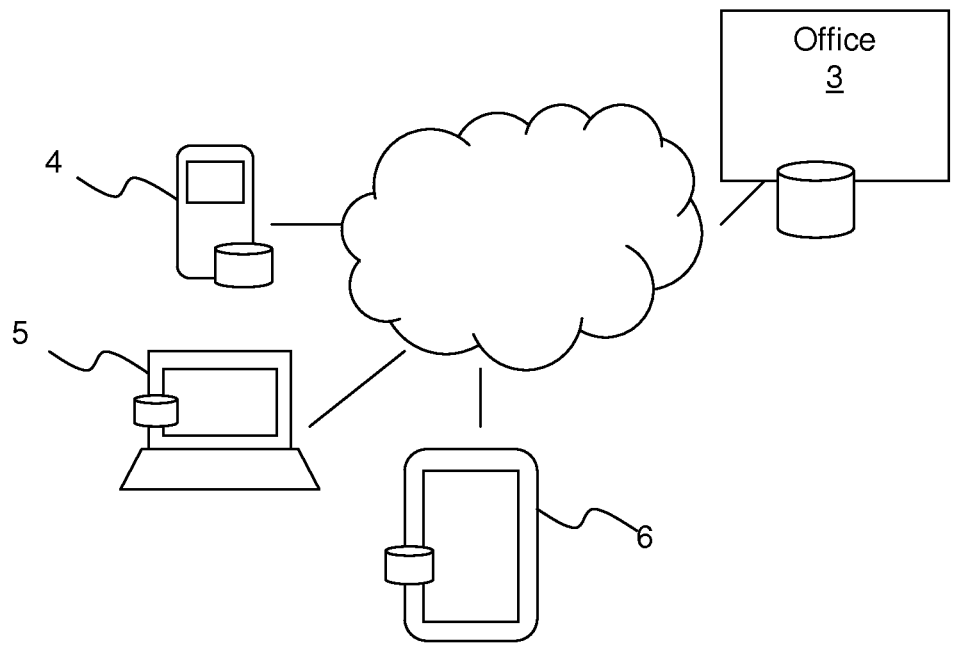
FIG. 2 illustrates schematically in a block diagram a network architecture and signalling for performing de-duplication when sending compressed data in an enterprise scenario with a mobile workforce.
Figure 3:
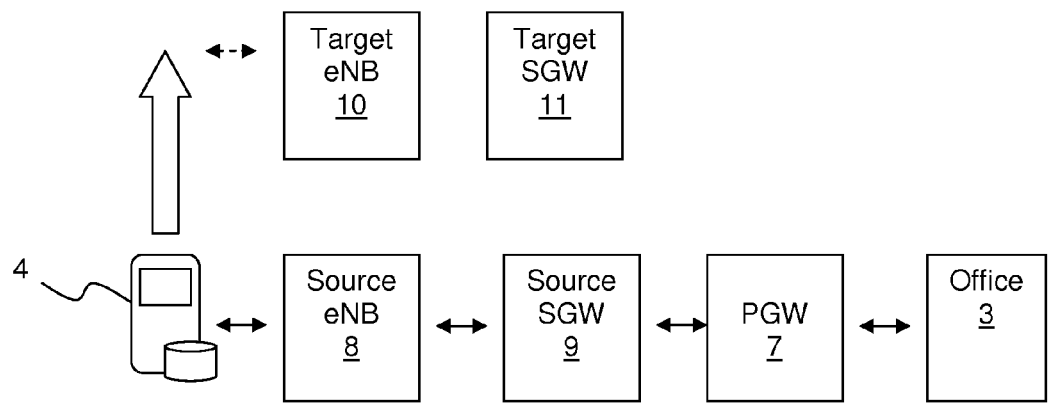
FIG. 3 illustrates schematically in a block diagram a network architecture and signalling for inter-SGW handover in an LTE network where compression and decompression is handled at a PGW.
Figure 4:
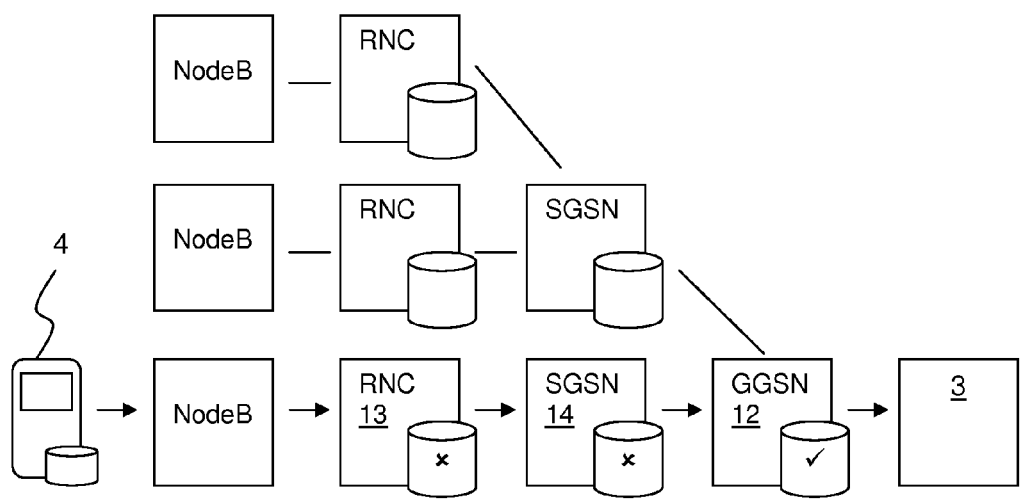
FIG. 4 illustrates schematically in a block diagram an exemplary network architecture and signalling to implement hierarchical decompression in an uplink according to an embodiment of the invention.

A situation in which a compression technique, such as de-duplication, is deployed in a mobile network is illustrated in FIG. 4. In this case one side of the compression (e.g. compressing data) is deployed at a mobile terminal 4 and the other side is deployed in a network node below the mobility anchor point (in this example, the mobility anchor point is a GGSN 12, but it could be, for example, a PDN Gateway).

Taking the case where the compressor is located at the mobile terminal 4, a hierarchic structure of de-compressor is provided below the mobility anchor point 12, meaning that intermediate nodes such as a RNC 13 and a SGSN 14 have decompression units in addition to the GGSN 12. The lower tier nodes (RNC 13, SGSN 14 in this example) may take on some of the decompression processing, thereby lightening the processing load on the higher tier nodes such as the GGSN 12.

The hierarchical structure increases the probability of identifying signatures and, thus, the compression gain. In the example of FIG. 4, the mobile terminal 4 compresses data and sends the compressed data on the uplink as shown by the arrows. Taking the example where data compression is performed by associating byte patterns with signatures, the compressed data sent from the mobile terminal includes signatures. The RNC 13 first receives the compressed data. If the RNC 13 has the relevant signature and byte pattern, a decompression unit at the RNC 13 will perform decompression. If the RNC 13 does not have the relevant signature, then the compressed data is passed to the SGSN 14. If the SGSN 14 has the relevant signature and byte pattern, a decompression unit at the SGSN 14 will perform decompression. If the SGSN 14 does not have the relevant signature, then the compressed data is passed to the GGSN 12, where the signature is identified and de-compressed.

Compared to known solutions where the compression/decompression is located only in a single tier, for example only at the SGSN 14, a hierarchical solution with several tiers off-loads the decompression (and processing) requirements at upper tier nodes such as the GGSN 12. Only unidentified signatures are passed to the upper tier. Several tiers may be provided, depending on the access technology. A hierarchical solution is especially beneficial when deployed in a mobile network scenario due to an increased likelihood of unknown signatures due mobile terminal mobility.

Note that the compression and de-compression units do not need to be deployed symmetrically and reside in the same tiers on the network side. Downlink compression could reside in an upper tier or a lower tier, whereas uplink de-compression could reside in several tiers as described above. The following description uses the term "compression operation" to refer to either of data compression or data de-compression.

The solution is based on two main principles during activation and execution.

When a de-compressor is activated it automatically searches for and identifies an upper and lower tier de-compressor (or it may have been notified of the existence and identity of an upper and/or lower tier de-compressor). This could be made by various means or a combination thereof, for example:
a by signalling in the mobile network control plane;
b by application signalling in the mobile network user plane; or
c by using information pre-configured via e.g. Operation and Maintenance (OAM)

If assuming only one de-compressor entity per node, the node identity may serve as identity of the de-compressor.

Figure 5:
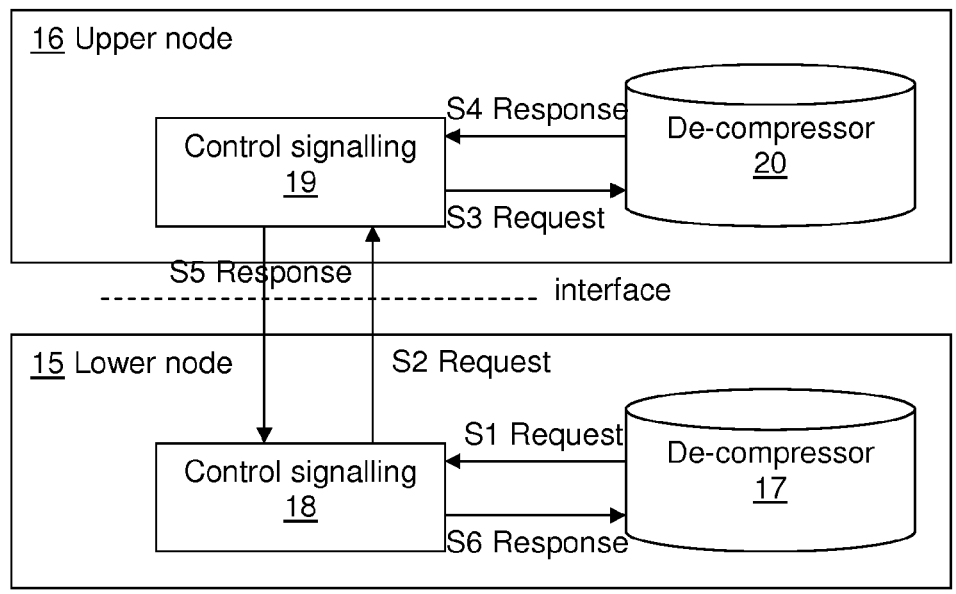
FIG. 5 illustrates schematically an exemplary search procedure based on mobile network signalling.

FIG. 5 illustrates an exemplary search procedure based on mobile network signalling where, in the example of a WCDMA network, a lower node 15 may be an RNC, an upper node 16 an SGSN, and the interface the Iu. The signalling messages over the interface are added and so any relevant standards may need to be amended. In this case, a de-compressor 17 at the lower node sends S1 a request to a control signalling entity 18 at the lower node 15, which in turn sends S2 a request to a control signalling entity 19 at the upper node 16. This is passed S3 to a de-compressor 20 at the upper node 16, which sends S4, S5, S6 a response to the de-compressor 17 at the lower node 15 identifying itself. The response is sent via the control signalling entity at the upper node and the control signalling entity at the lower node.

Figure 6:
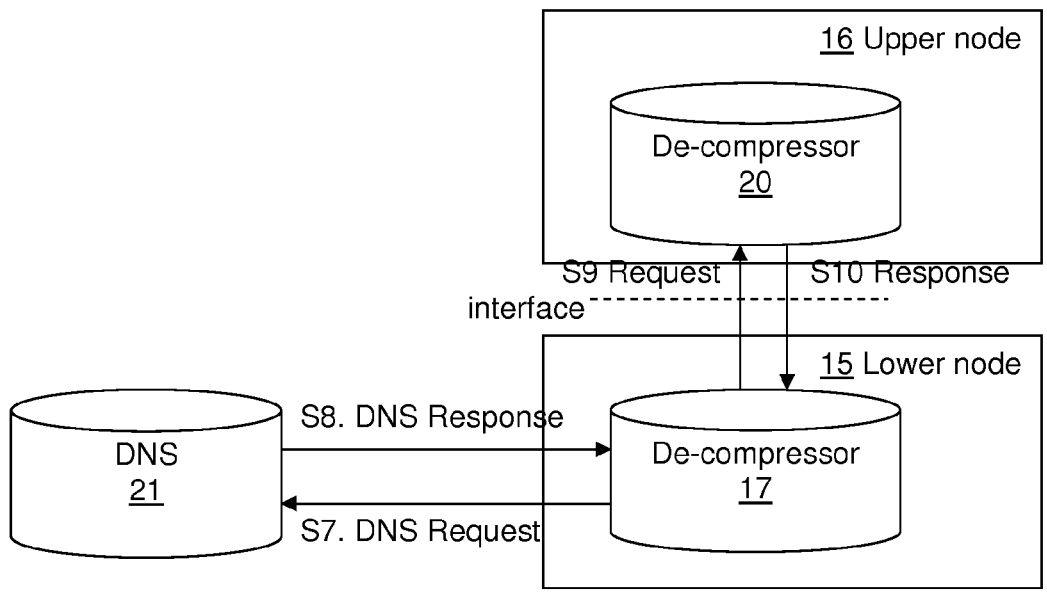
FIG. 6 illustrates schematically an exemplary search procedure based on mobile network signalling within a mobile network IP domain

FIG. 6 illustrates an exemplary search procedure based on mobile network signalling within the mobile network IP domain. In this case the de-compressor 17 at the lower node 15 sends S7 a DNS request to a DNS server 21 and receives S8 a response identifying the upper node 16. A request S9 is sent to the de-compressor 20 at the upper node 16, which responds S10.

Figure 7:
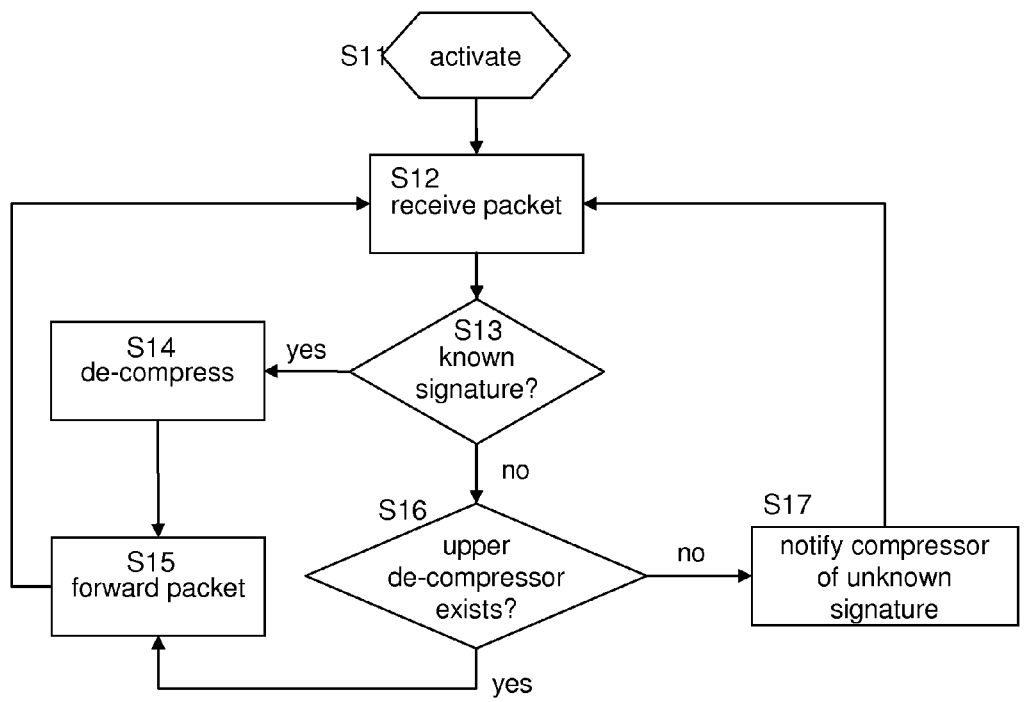
FIG. 7 is a flow diagram showing steps of an exemplary way to implement hierarchical decompression.

Once the de-compressors have been activated, when a mobile terminal 4 during mobility enters, for example, a new RNC or SGSN, the de-compressor in that node may not have learnt the signatures used by the mobile terminal 4 compressor. In legacy solutions the de-compressor at the RNC 13 or SGSN 14 would at this stage respond to the compressor, indicating an unknown signature, triggering a new learning phase and requiring the compressor at the mobile terminal 4 to re-commence sending information uncompressed. However, using the hierarchical solution described above, the de-compressor at the RNC 13 or SGSN 14 passes the unknown signatures upwards to the upper tier 12 de-compressor, if such a de-compressor is identified during activation. When a signature reaches the upper most de-compressor without being identified, this de-compressor will act as a legacy de-compressor. FIG. 7 illustrates the execution procedure, with the following numbering corresponding to that of FIG. 7:

S11. The de-compressors in the uplink between the mobile terminal 4 and the mobility anchor point are activated and each finds the de-compressor above it in the hierarchy.

S12. A node with a de-compressor (e.g. the RNC 13) receives a packet containing compressed data.

S13. The node 13 checks to determine whether it has the compression information (such as a signature and associated byte pattern) required to decompress the data. If it does, then the procedure continues at step S14, if it does not then the procedure continues at step S16.

S14. The data in the packet is decompressed.

S15. The packet containing decompressed data is forwarded to the next node in the uplink. The procedure reverts to step S12 at the next node in the hierarchy.

S16. As the node 13 does not have the required compression information, it checks to see if an upper tier de-compressor exists (such as a de-compressor located at a SGSN 14). If it does, then the procedure continues at step S15, with the packet containing compressed data.

S17. If no upper tier de-compressor exists, the compressor at the mobile terminal 4 is notified that the signature is unknown, and a new learning procedure is initiated.

Note while FIG. 7 refers to an uplink for decompressing data payloads send from a mobile terminal, a similar procedure could be put in place for compressing downlink data payloads to be sent to the mobile terminal.

Figure 8:
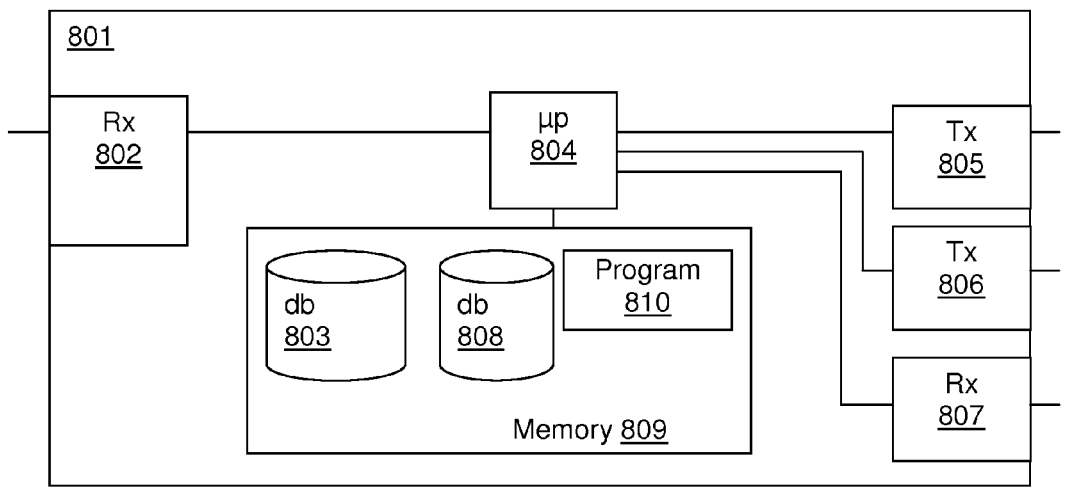
FIG. 8 illustrates schematically in a block diagram a network node for decompressing uplink data packets according to an embodiment of the invention.

FIG. 8 illustrates an intermediate network node 801, such as an RNC 13, SGW or a SGSN 14, located between the mobile terminal 4 and the mobility anchor point. In this case, the network node 801 is configured to decompress uplink traffic sent from the mobile terminal 4. The network node 801 is provided with a receiver 802 for receiving a packet comprising compressed data sent from the mobile terminal towards the mobility anchor point. A database 803 containing compression information such as signatures and associated byte strings is provided. A processor 804 is provided for determining whether the database 803 includes compression information required to decompress the compressed data. If the database 803 includes the required compression information, the processor 804 decompresses the data packet and sends it towards the mobility anchor point using a transmitter 805. If the database 803 does not include required compression information required, the packet is forwarded to an uplink node for decompression at the uplink node. The data is in either case is forwarded towards the same node, with the difference that it is either decompressed or compressed. If the data is compressed, the decompressor of the upper node will take care of the compressed flow (the flow will have a mix of compressed and uncompressed data so the de-compressors at every stage must scan the flow to see if some signatures are left to be uncompressed).

The processor 804 may be arranged to determine an identity of the uplink node having de-compression capability. In this case the network node 801 is provided with either a second transmitter 806 and receiver 807 for sending a request to a DNS server or uplink node, or preconfigured data stored in a second database 808 identifying the uplink node.

A non-transitory computer readable medium in the form of a memory 809 may be provided that can be used to store the first database 803 and second database 809. Furthermore, the memory 809 may be used to store a computer program 810 which, when executed by the processor 804, causes the network node 801 to implement the decompression procedures described above.

It will be appreciated that elements illustrated in FIG. 8 may be implemented in one or more physical embodiments. For example, the processor 804 may be a plurality of separate processors, and the memory 809 may be a plurality of different physical memories. Similarly, the transmitters and receivers may be implemented in the same physical transmitter or receiver, or as one or more transceivers.

Figure 9:
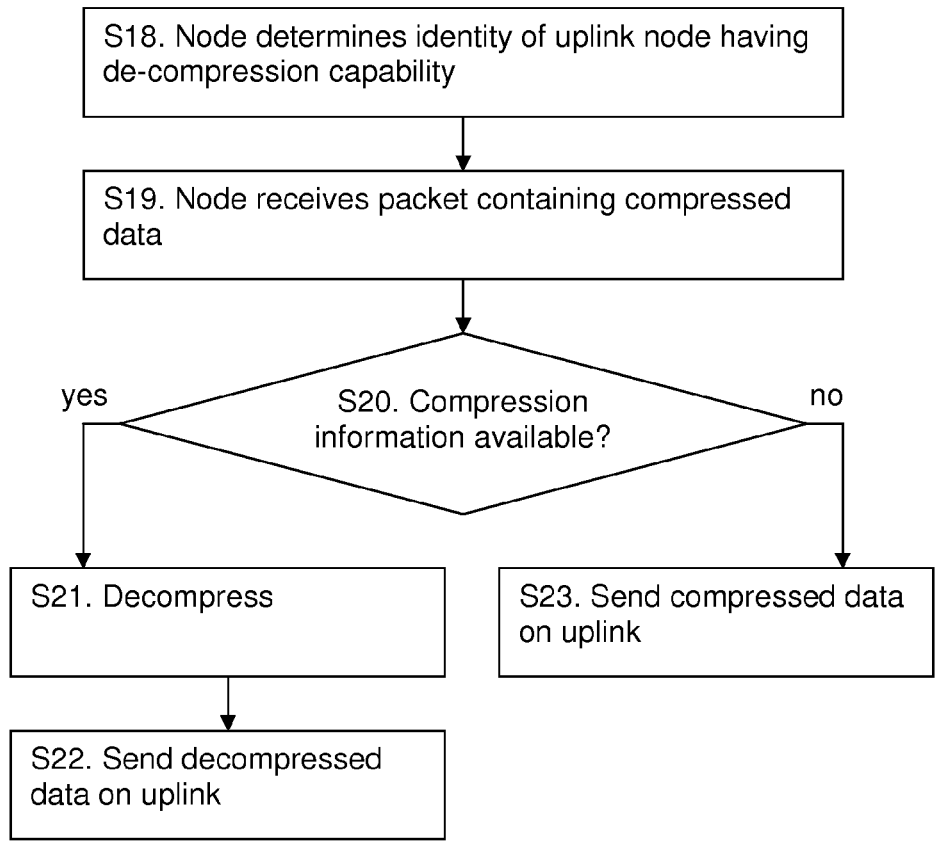
FIG. 9 is a flow diagram illustrating exemplary de-compression.

FIG. 9 is a flow diagram illustrating exemplary steps performed by the intermediate network node 801. The following numbering corresponds to that of FIG. 9:

S18. In an optional embodiment, the intermediate node 801 determines an identity of an uplink node having de-compression capability.

S19. The intermediate node 801, located between the mobile terminal 4 and a mobility anchor point node 12, receives a packet comprising compressed data.

S20. A check is made to determine if the intermediate node 801 has access to compression information required to decompress the compressed data. If so then the process continues at step S21, if not then the process continues at step S23.

S21. The intermediate node 801 decompresses the compressed data.

S22. The de-compressed data is sent towards the mobility anchor point 12, and the process ends.

S23. As the intermediate node 801 does not have access to compression information required to de-compress the compressed data, it forwards the packet containing compressed data to an uplink node for decompression at the uplink node.

Figure 10:
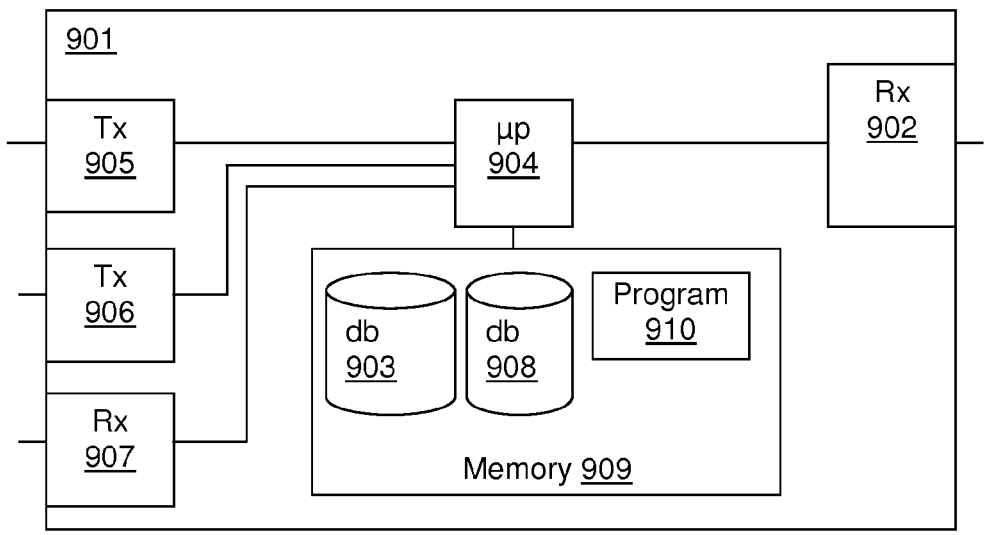
FIG. 10 illustrates schematically in a block diagram a network node for compressing downlink data packets according to an embodiment of the invention.

FIG. 10 illustrates an intermediate network node 901, such as an RNC 13, SGW or a SGSN 14, located between the mobile terminal and the mobility anchor point 12. In this case, the network node 901 is configured to compress downlink traffic sent towards the mobile terminal 4. The network node is provided with a receiver 902 for receiving a packet comprising uncompressed data sent towards the mobile terminal 4. A database 903 containing compression information such as signatures and associated byte strings is provided. A processor 904 is provided for determining whether the database 903 includes compression information required to compress the uncompressed data. If the database 903 includes the required compression information, the processor 904 compresses the data packet and sends it towards the mobile terminal 4 using a transmitter 905. If the database 903 does not include required compression information required, the packet is forwarded to a downlink node for compression at the downlink node.

The processor 904 may be arranged to determine an identity of the downlink node having compression capability. In this case the network node 901 is provided with either a second transmitter 906 and receiver 907 for sending a request to a DNS server 21 or a downlink node, or preconfigured data stored in a second database 908 identifying the downlink node.

A non-transitory computer readable medium in the form of a memory 909 may be provided that can be used to store the first database 903 and second database 909. Furthermore, the memory 909 may be used to store a computer program 910 which, when executed by the processor 904, causes the network node 901 to implement the decompression procedures described above.

It will be appreciated that elements illustrated in FIG. 9 may be implemented in one or more physical embodiments. For example, the processor 904 may be a plurality of separate processors, and the memory 909 may be a plurality of different physical memories. Similarly, the transmitters and receivers may be implemented in the same physical transmitter or receiver, or as one or more transceivers.

Figure 11:
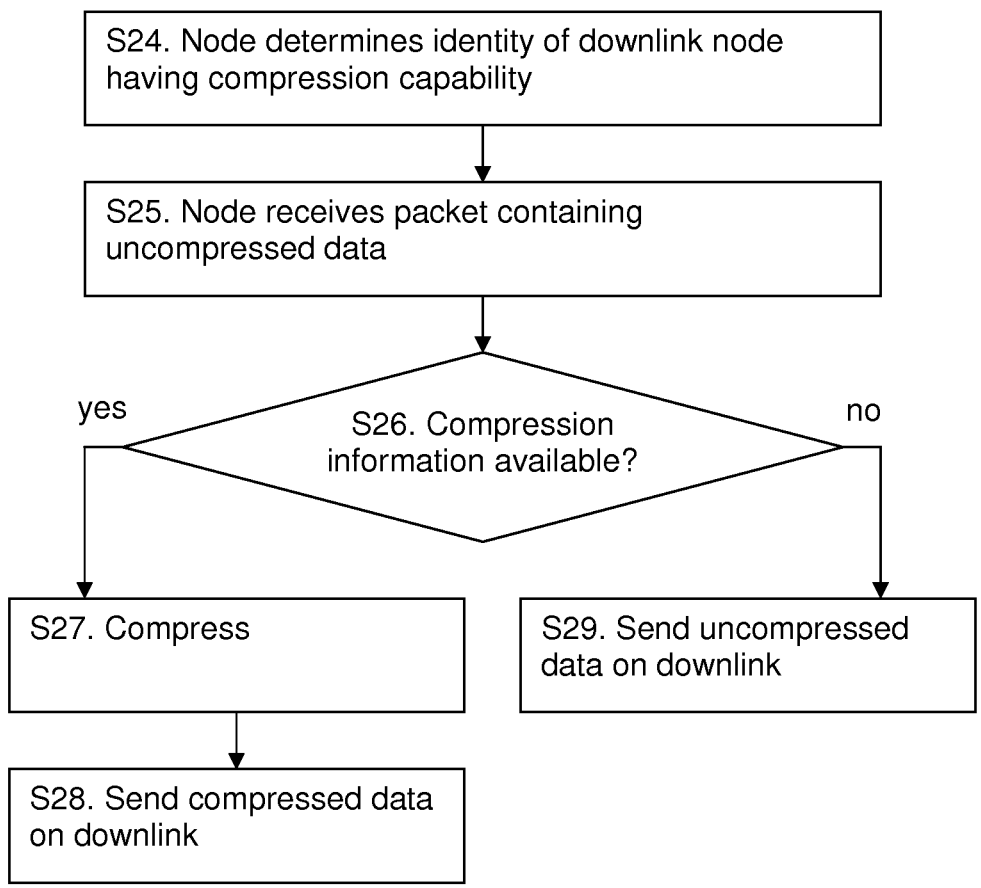
FIG. 11 is a flow diagram illustrating exemplary compression.

FIG. 11 is a flow diagram illustrating exemplary steps performed by the intermediate network node 901. The following numbering corresponds to that of FIG. 11:

S24. In an optional embodiment, the intermediate node 801 determines an identity of a downlink node having compression capability.

S25. The intermediate node 901, located between the mobile terminal 4 and a mobility anchor point node 12, receives a packet comprising uncompressed data.

S26. A check is made to determine if the intermediate node 901 has access to compression information required to compress the uncompressed data. If so then the process continues at step S27, if not then the process continues at step S29.

S27. The intermediate node 901 compresses the uncompressed data.

S28. The compressed data is sent towards the mobile terminal 4, and the process ends.

S23. As the intermediate node 901 does not have access to compression information required to compress the uncompressed data, it forwards the packet containing uncompressed data to a downlink node for compression at the downlink node.

It will be appreciated that the same node may include functional elements shown in FIG. 8 to perform decompression on the uplink as well as functional elements shown in FIG. 9 to perform compression on the downlink.

It will be appreciated by the person of skill in the art that various modifications may be made to the above described embodiment without departing from the scope of the present invention. For example, the functions of the network node are described as being embodied at a single node, but it will be appreciated that different functions may be provided at different network nodes. Furthermore, de-duplication is described as an example of data compression/de-compression, but it will be appreciated that the principles of the invention apply to other forms of compression such as data differencing. In addition, the examples above mostly describe an LTE network, but it will be appreciated that the same techniques can be used in any type of mobile network for implementing compression and/or decompression on either of a downlink or an uplink.

The following acronyms have been used in the above description:
DL Downlink
DNS Domain Name System
eNodeB enhanced Node B
GGSN Gateway GPRS Support Node
GPRS General Packet Radio Service
IE Information Elements
LTE Long Term Evolution
OAM Operation and Maintenance
PDN Packet Data Network
PGW PDN Gateway
QoE Quality of Experience
RAN Radio Access Network
RIM RAN Information Management
RNC Radio Network Controller
SGSN Serving GPRS Support Node
SGW Serving Gateway
SI Signalling Information
SIB Signalling Information Block
TCP Transport Control Protocol
UL Uplink
WAN Wireless Area Network
WCDMA Wideband Code Division Multiple Access

The invention claimed is:

1. A method of performing a compression operation on data in a mobile communication network, the method comprising:
    at an intermediate node located between a mobile terminal and a mobility anchor point node, receiving a data payload;
    determining, prior to receiving the data payload, by the intermediate node an identity of a next node having a capability of performing the compression operation;
    in the event that the intermediate node has access to compression information required to perform the compression operation, performing the compression operation to generate a modified data payload and sending the modified data payload to the next node; and
    in the event that the intermediate node does not have access to compression information required to perform the compression operation, sending the data payload to the next node,
    wherein the compression operation comprises at least one of a data de-compression and a data compression.

2. The method according to claim 1, wherein the compression operation comprises data de-compression, wherein the data payload comprises compressed data and the modified data payload comprises de-compressed data.

3. The method according to claim 1, wherein the compression operation comprises compression, wherein the data payload comprises uncompressed data and the modified data payload comprises compressed data.

4. The method according to claim 1, wherein the compression information comprises a signature and an associated byte pattern.

5. The method according to claim 1, wherein the intermediate node is selected from any of an enhanced Node B, a Radio Network Controller, a Serving GPRS Support Node and a Serving Gateway.

6. The method according to claim 1, wherein the mobility anchor point node is selected from any of a Packet Data Network Gateway and a Gateway GPRS Support Node.

7. The method according to claim 1, further comprising determining the identity of the next node using any of signalling in a mobile network control plane, application signalling in a mobile network user plane, and using pre-configured information identifying the next node.

8. A network node for handling a compression operation on data in a mobile communication network, the network node comprising:
    a receiver for receiving a data payload;
    a database containing compression information;
    a processor for determining whether the database includes compression information required to perform the compression operation;
    the processor being arranged to determine, prior to receiving the data payload, an identity of a next node having a capability of performing the compression operation;
    the processor being arranged to, in the event that the database includes compression information required to perform the compression operation, perform the compression operation to generate a modified data payload, and send the modified data payload to the next node via a transmitter; and
    the processor being further arranged to, in the event that the database does not include compression information required to perform the compression operation, send the data payload to the next node,
    wherein the compression operation comprises at least one of a data de-compression and a data compression.

9. The network node according to claim 8, wherein the processor is arranged to perform data de-compression, wherein the data payload comprises compressed data and the modified data payload comprises de-compressed data.

10. The network node according to claim 8, wherein the processor is arranged to perform data compression, wherein the data payload comprises uncompressed data and the modified data payload comprises compressed data.

11. The network node according to claim 8, wherein the compression information comprises a signature and an associated byte pattern.

12. The network node according to claim 8, wherein the network node is selected from any of an enhanced Node B, a Radio Network Controller, a Serving GPRS Support Node and a Serving Gateway.

13. The network node according to claim 8, further comprising:
    a second transmitter for sending a request to the next node; and
    a second receiver for receiving a response from the next node, the response indicating any of an identity and capabilities of any of a compressor and a decompressor located at the next node.

14. The network node according to claim 8, further comprising a second database, the second database comprising pre-configured information identifying the next node.

15. A non-transitory computer readable storage medium having stored thereon a computer program which, when run on a network node located between a mobile terminal and a mobility anchor point node in a mobile communication network, causes the network node to perform a method comprising:

receiving a data payload;

determining, prior to receiving the data payload, by the network node an identity of a next node having a capability of performing the compression operation;

in the event that the network node has access to compression information required to perform the compression operation, performing the compression operation to generate a modified data payload and sending the modified data payload to the next node; and in the event that the network node does not have access to compression information required to perform the compression operation, sending the data payload to the next node, wherein the compression operation comprises at least one of a data de-compression and a data compression.

* * * * *